(12) United States Patent
Nam et al.

(10) Patent No.: US 9,514,918 B2
(45) Date of Patent: Dec. 6, 2016

(54) GUARD APERTURE TO CONTROL ION ANGULAR DISTRIBUTION IN PLASMA PROCESSING

(71) Applicants: Sang Ki Nam, Danville, CA (US); Ludovic Godet, Sunnyvale, CA (US)

(72) Inventors: Sang Ki Nam, Danville, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 88 days.

(21) Appl. No.: 14/502,794

(22) Filed: Sep. 30, 2014

(65) Prior Publication Data

US 2016/0093409 A1     Mar. 31, 2016

(51) Int. Cl.
*C23C 16/50*     (2006.01)
*H01J 37/32*     (2006.01)
*C23C 16/04*     (2006.01)

(52) U.S. Cl.
CPC ......... *H01J 37/3244* (2013.01); *C23C 16/042* (2013.01); *C23C 16/50* (2013.01); *H01J 37/32357* (2013.01); *H01J 37/32422* (2013.01); *H01J 37/32568* (2013.01); *H01J 37/32623* (2013.01); *H01J 37/32706* (2013.01)

(58) Field of Classification Search
CPC ...................... H01J 37/32009; H01J 37/32532; H01J 37/32541; H01J 37/32568
See application file for complete search history.

(56) References Cited

U.S. PATENT DOCUMENTS

| | | | | |
|---|---|---|---|---|
| 6,468,386 | B1* | 10/2002 | Jeffryes | C23C 16/45565 118/723 E |
| 2005/0136691 | A1* | 6/2005 | Le | C23C 14/083 438/785 |
| 2012/0091358 | A1* | 4/2012 | Wieland | H01J 37/1471 250/396 R |
| 2012/0228515 | A1* | 9/2012 | Leavitt | H01J 37/3023 250/396 R |
| 2012/0255492 | A1* | 10/2012 | Wu | C23C 16/0245 118/723 E |
| 2012/0289054 | A1* | 11/2012 | Holland | H01J 37/32082 438/711 |
| 2013/0020027 | A1* | 1/2013 | Kamijo | H01J 37/32091 156/345.43 |

* cited by examiner

*Primary Examiner* — Nicole Ippolito
*Assistant Examiner* — Sean Luck
(74) *Attorney, Agent, or Firm* — Blakely Sokoloff Taylor Zafman LLP

(57) ABSTRACT

A guard aperture is described to control the ion angular distribution in plasma processing in one example a workpiece processing system has a plasma chamber, a plasma source to generate a plasma containing gas ions in the plasma chamber, the plasma forming a sheath above the workpiece, the sheath having an electric field, a workpiece holder in the chamber to apply a bias voltage to the workpiece to attract ions across the plasma sheath to be incident on the workpiece, a control aperture between the sheath and the workpiece, the aperture being positioned to modify an angular distribution of the ions that are incident on the workpiece, and a guard aperture between the sheath and the control aperture to isolate an electrical field of the control aperture from the plasma sheath.

15 Claims, 8 Drawing Sheets

GUARD APERTURE TO CONTROL ION ANGULAR DISTRIBUTION IN PLASMA PROCESSING

TECHNICAL FIELD

The present description relates to plasma processing and, in particular, to controlling ion angular distribution in a plasma using a guard aperture and a control aperture.

BACKGROUND

Plasma processing systems generate a plasma in a processing chamber that is then applied to a workpiece. The workpiece is supported in the chamber on a platen, a pedestal, a chuck, or some other support. The plasma may be used to perform a variety of different processes on the workpiece. These include etching material off the workpiece, doping materials that are already on the workpiece and adding material to the workpiece by deposition. The effects of these processes can be controlled by photolithography, screening, masking, coating and other processes.

The plasma itself is generated using a high voltage power supply and an input gas. The plasma generates a collection of ions and electrons with positive, negative and neutral electric charge that in combination has an overall quasi-neutral electric charge. This collection of plasma near the generator is driven across a sheath toward the workpiece by a bias voltage applied to the workpiece. The bias voltage generates an electrical field around the workpiece to attract ions through the sheath.

The plasma sheath is formed on any surface exposed to the plasma. There is a high electric field within the sheath. The field can accelerate positive ions and repel negative ions and electrons. When a workpiece is placed in a processing chamber and exposed to the plasma a sheath forms in a shape that conforms to the top of the workpiece surface. Similarly, a sheath will form on a grid placed between the plasma and the workpiece. The thickness and electric field of the sheath are determined by the relative voltage potential between the workpiece and the plasma. By applying a bias voltage to the workpiece, the ions of the plasma can be accelerated by the sheath to the workpiece.

In some systems, there is a grid between the sheath and the workpiece to direct the ions of the plasma sheath in a particular direction. The angular propagation of the ions can be used to control how the etching, doping, or deposition processes affect the workpiece. The ion energy distribution function (IEDF) describes the distribution of energy with which the ions impact a workpiece surface. The ion angular distribution function (IADF) describes the distribution of the angle of incidence of the ions on the surface with respect to the normal from the surface. Ion energy distribution and angle distribution are descriptors for the interaction between a plasma and topographical features on the workpiece.

SUMMARY

A guard aperture is described to control the ion angular distribution in plasma processing. In one example a workpiece processing system has a plasma chamber, a plasma source to generate a plasma containing gas ions in the plasma chamber, the plasma forming a sheath above the workpiece, the sheath having an electric field, a workpiece holder in the chamber to apply a bias voltage to the workpiece to attract ions across the plasma sheath to be incident on the workpiece, a control aperture between the sheath and the workpiece, the aperture being positioned to modify an angular distribution of the ions that are incident on the workpiece, and a guard aperture between the sheath and the control aperture to isolate an electrical field of the control aperture from the plasma sheath.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
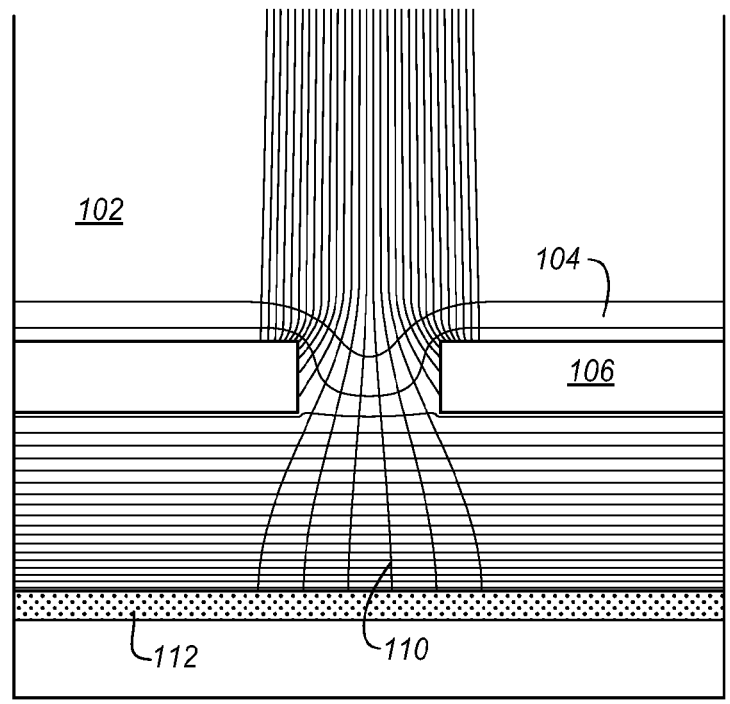
FIGS. 1A, 1B, 1C, and 1D are diagrams of a plasma processing apparatus showing ion path angles with different sheath thicknesses proximate an angle modifier aperture.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicate that two or more elements are in either direct or indirect (with other intervening elements between them) physical, optical, or electrical contact with each other, and/or that the two or more elements co-operate or interact with each other (e.g., as in as cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

During plasma doping processes and many other plasma processes, most of the ions accelerated inside the high voltage sheath reach the target perpendicularly to the surface with an angular spread of less than 5°. For many other processes, including 3D doping, angles higher than 5° are desired to obtained better conformality. Some applications for 3D doping include building FinFET structures, carbon nanotube fabrication, complementary metal oxide semiconductor, imager trench fabrication, and other processes. In addition to higher incident angles, a higher angular spread can be used to treat PR (photoresist) after implant and etch processes without impacting an underlying substrate. This can be used to make the PR easier to strip off in subsequent processes.

Plasma sheath engineering uses techniques and equipment to control the ion incidence angle. While ions are typically implanted perpendicular to the top surface of the workpiece, such as a silicon wafer, by engineering the plasma sheath this perpendicular direction can be changed. One technique is to modulate the plasma sheath bias voltage. Under some circumstances the modulation causes ions to be implanted on the wafer with a large angular spread. The IADF (Ion Angular Distribution Function) can also be tuned by modulating the electric field in the sheath. A bimodal IADF can also be obtained by plasma sheath engineering and can be used for conformal doping.

The fabrication process of a workpiece in a plasma chamber may be better controlled by controlling both the IEDF (Ion Energy Distribution Function) and the IADF to favor a desired process. By tuning the driven plasma frequency and the bias frequency applied to a sheath grid through the workpiece bias voltage, an ion flux can be produced from a plasma with a desired energy distribution along a desired angle.

The sheath grid design may also be adapted for better precision. A variety of different structures may be used as a plasma angle modifier. A grid is a conventional structure but other structures that apply a charge across one or more apertures, openings or holes may be used. These structures are referred to generally as angle modifiers herein because they are used to modify the angular distribution of ions from the plasma. With this ion angular distribution control technique, much better profile control and better selectivity are obtained. The plasma may be used for anisotropic etch, isotropic etch, directional film deposition and other processes. The bias voltage frequency and bias voltage amplitude provide helpful parameters for tuning a process for better and more accurate process control.

The ion energy distribution of an RF (Radio Frequency) plasma is correlated to the driven bias voltage frequency. The plasma's ion energy distribution when driven at RF bias voltage is a bimodal distribution. The lower the driven frequency, the greater the energy separation between the two energy peaks of the bimodal distribution. At higher driven frequencies, the ions are not able to respond to the higher frequency but only the average sheath voltage. As a result, the ion energy distribution is more like a distribution with a single peak. The peaks may also be controlled by pulsing the RF energy.

In a plasma process chamber in which there is an angle modifier between the plasma sheath and a workpiece, the physical dimensions of the angle modifier change the direction of the ions between the sheath and the workpiece. By changing the plasma sheath thickness and angle modifier dimensions, ions can be extracted from the plasma along different angles. Accordingly, when processing a workpiece with a plasma, the ion energy distribution and the preferred angle distribution can be controlled using the driven RF bias voltage frequency and the angle modifier.

When the angle modifier between the plasma sheath and the workpiece has a gap defined by two panels of the angle modifier, the electric field lines between the plasma sheath and the workpiece are shaped by the angle modifier. The panels may be made of a conductive, semiconductor, or dielectric material. In many cases an arcuate boundary is formed between the plasma and the plasma sheath over the gap. This arcuate boundary will typically have a convex shape relative to the angle modifier and therefore to the plane of the top surface of the workpiece. The shape of the boundary is also influenced by any bias voltage that might be applied to the angle modifier. For other angle modifier configurations, the boundary will be formed to other shapes.

The arcuate shape of the boundary affects the electric field lines within the plasma sheath. The incident angles at which the ions strike the workpiece will be distributed consistent with the influence of the electric field. A large range of incident angles enables conformal doping of three dimensional structures. For example, the sidewalls of a trench structure may be more uniformly doped with ions having a large range of incident angles. Other boundary shapes will cause the ions to strike the workpiece at other angles which may correspond to a wide or narrow range.

FIG. 1A is a diagram of plasma processing using an extraction plate 106 as the angle modifier with a simple aperture or gap in the plate between a plasma sheath 104 and a workpiece 112. A plasma 102 may be generated in any of a variety of different ways. A workpiece 112 is supported inside the chamber on a platen, pedestal, chuck, table, or other support. A plate 106 is positioned between the plasma and the workpiece. A plasma sheath 104 is formed between the plasma and the workpiece and is shaped based, at least in part on the configuration of the plate. The sheath shape depends on the plate geometry, the plasma parameters, and the bias voltage, if any, that is applied to the plate.

The plate 106 is optionally connected to an actuator (not shown) that is able to move the plate in the Z-direction to change the effect of the plate. In other words, the vertical spacing (Z) between the plate which functions as a sheath modifier 106 and the plane defined by the top surface of the workpiece may be adjusted. The actuator may be mechanically coupled to the one or more pieces of the plate to drive the two pieces in a vertical direction relative to the workpiece. The Z position of the pieces of the plate relative to the top plane of the workpiece, and also relative to each other, influences the shape of the boundary between the plasma and the plasma sheath and also the trajectories of the ions striking the workpiece. The actuator may include or be controlled by a controller (not shown). Alternatively, the plate may be configured for a particular process outside of the plasma chamber and installed into the chamber without further adjustment so that no actuator is used.

Figure 1B:
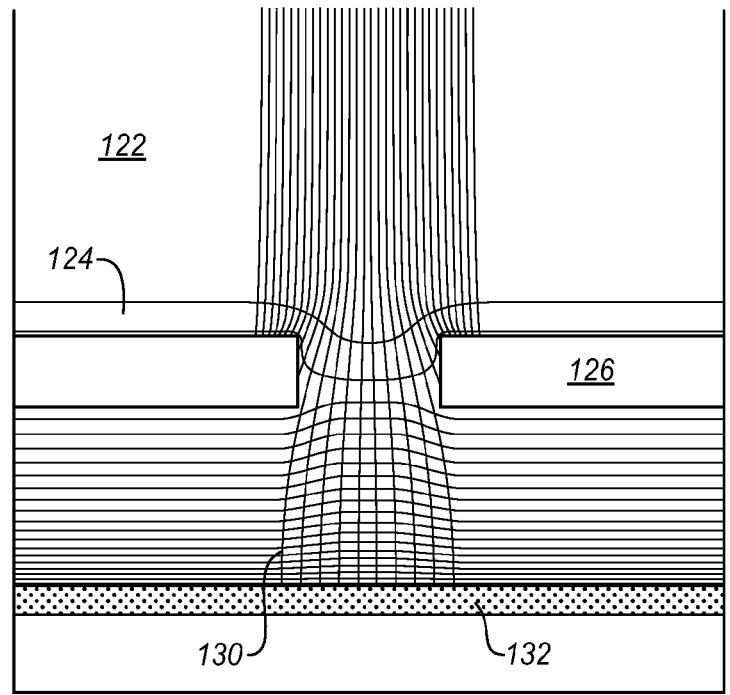
Figure 1C:
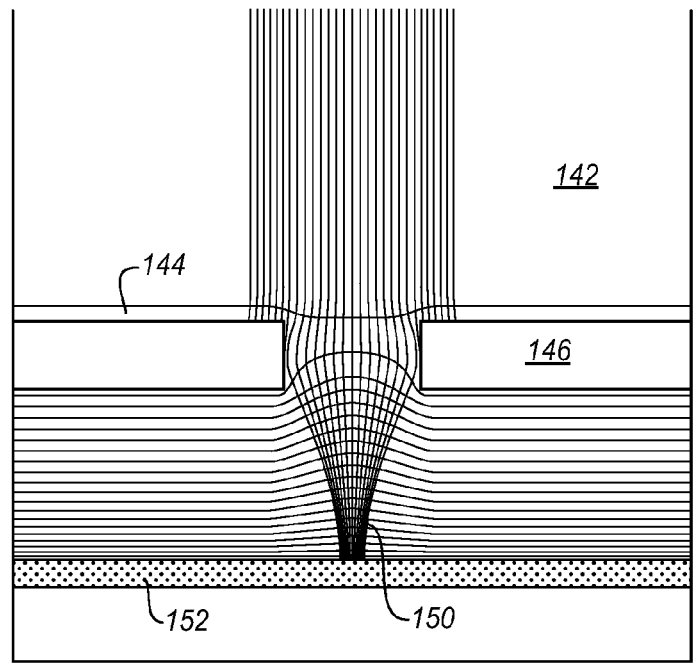

FIG. 1A is based on a simulated angle modifier in a typical plasma ion deposition chamber. The angle modifier 106 generates an electric field across the aperture between the two plates of the angle modifier. In the example of FIG. 1A, the electric field lines are nearly parallel and horizontal across the aperture. The plasma 102 and the plasma sheath 104 are drawn down through the aperture by the electric field across the aperture. In FIG. 1B, the electric field lines curve upward around the aperture and the plasma sheath is drawn downward less than in FIG. 1A. In FIG. 1C, the electric field lines extend still further upward and the plasma and plasma sheath make almost no dip into the aperture.

A path 110 of the ions from the plasma sheath 104 to the workpiece 112 is shown as a series of vertical lines. These path lines are curved based on the electrical field lines because the ions have a positive or a negative charge and are therefore drawn by the electrical field. As the electrical field curves more up into the aperture, the ions are drawn closer together as they exit the aperture toward the workpiece.

FIG. 1B is a diagram of the plasma processing system of FIG. 1A in which the actuator has moved an angle modifier in the form of a plate 126 closer to a plasma 122. Alternatively, this configuration may be obtained by changing the plasma parameters, such as plasma density and electron temperature, or the bias voltage on the plate. These factors all may be used to change the thickness of the sheath 124. In the illustrated example, the distance S between the plasma and the plate is greater than the size d of the gap between parts of the plate. As a result, an ion path 130 is pulled more directly through the plate aperture to a workpiece 132. This plate configuration may be used to provide direct vertical ion impact on the top surface of the workpiece in each location that is directly beneath a gap. The position of the impact may be adjusted by moving the plate or by moving the workpiece.

FIG. 1C is a diagram of the plasma processing system of FIG. 1A in which an actuator has moved the plate 146 to a position in which the sheath thickness S is about the same as the distance d across a gap. This may also be accomplished without moving the plate but by changing the plasma 142 and sheath 144 bias voltage parameters. In this case, an arcuate sheath boundary is formed above the plate so that the ions are drawn across the sheath 144 in a path 150 that converges at a particular point above a workpiece 152. The angular distribution of ions on the workpiece may be further affected by adjusting the position of the workpiece.

In this case the boundary between the plasma and the plasma sheath has a convex shape relative to the workpiece. The boundary may have a deeper or shallower shape depending on the specific Z position of the plate. The angular spread of ions striking the workpiece with a relatively lower Z-position is greater than the angular spread of ions striking the workpiece with a relatively higher Z-position. In addition, ions strike a wider horizontal spacing across the surface of the workpiece with the lower Z-position compared to the horizontal spacing with the higher Z-position.

The relationship between S and d may be adjusted by changing S as shown, or by changing d. The horizontal spacing d between two pieces of the plate may be adjusted to change the width of the aperture or gap. An actuator may be mechanically coupled to at least one of the pieces or the plate may be pre-configured.

Figures 2, 3:
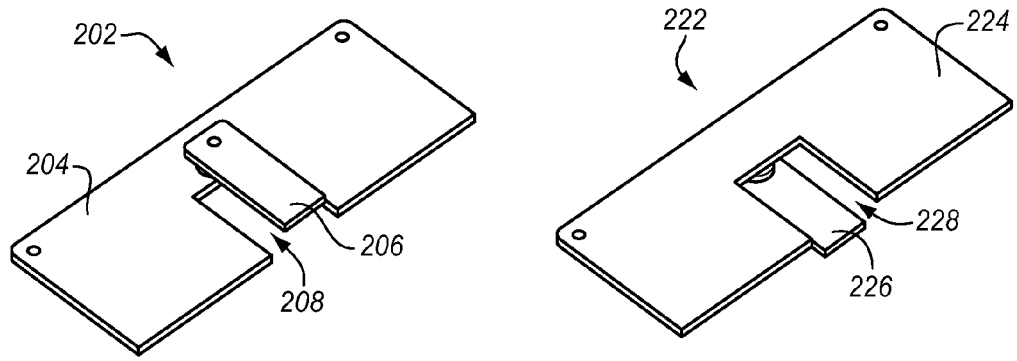
FIGS. 2 and 3 are perspective views of a portion of a sheath modifying angle modifier or a guard plate showing an ion aperture according to an embodiment of the present invention.

A relatively shorter horizontal gap position provides a narrower convex boundary between the plasma and the plasma sheath. As a result, a larger corresponding central portion of the workpiece is struck with ions. A wider horizontal gap generates a wider convex boundary shape that is flatter and less circular. This creates a narrower impact area for ions traveling through the gap. The difference between the spread beam of FIG. 1A, the collimated beam of FIG. 1B, and the converged beam of FIG. 1C depends on the relationship between S and d, if the sheath thickness S remains constant, then a converged beam is obtained by using a wider horizontal plate gap. The ion beam may become as collimated beam by using a shorter horizontal plate gap FIG. 2 is a perspective view of a portion of an alternative plate 202 with two levels. A base plate 204 forms the primary structure of the plate and includes a slot or gap 208 as described above with respect to FIGS. 1A, 1B, and 1C. A second plate 206 is placed in, above, or below the gap. In FIG. 2, the second plate is above the gap. In FIG. 3 an alternative plate 222 has a base plate 224 with a slot 228 and a second plate 226 below the gap or slot. The position of the second plate may be altered to suit different applications. There may also be actuators to move the second plate with respect to the base plate as well as to move the entire plate with respect to the plasma or the workpiece. The two plates may be fastened together to form a single assembly. This allows the displacement between the sheets to be set before installation into the chamber. In the example of FIG. 2, the gap in the first sheet does not extend all the way through the second sheet so that the gap is in the form of as slot on one side. The second sheet shows a bolt at one end that fastens the second sheet to the first sheet at a position just outside the gap. Shims or spacers of different sizes may be used to adjust the vertical displacement of the second sheet. The second sheet may also be mounted on either side of the first sheet as shown by comparing FIG. 2 to FIG. 3.

The two-part plates of FIGS. 2 and 3 form a bimodal angle modifier plate. The plate may be grounded or a bias voltage may be applied so that the sheath thickness may be modified to be either increased or decreased, depending on the particular use for the plasma. The bias applied to the plate may also be allowed to float so that the ions are focused by the sheath around the surface of the plate. Only a single gap 208, 228 and a single second plate piece 206, 226 are shown for simplicity. There may be many more gaps depending on the workpiece, the process that is to be performed, the processing chamber, and the particular implementation.

Figure 1D:
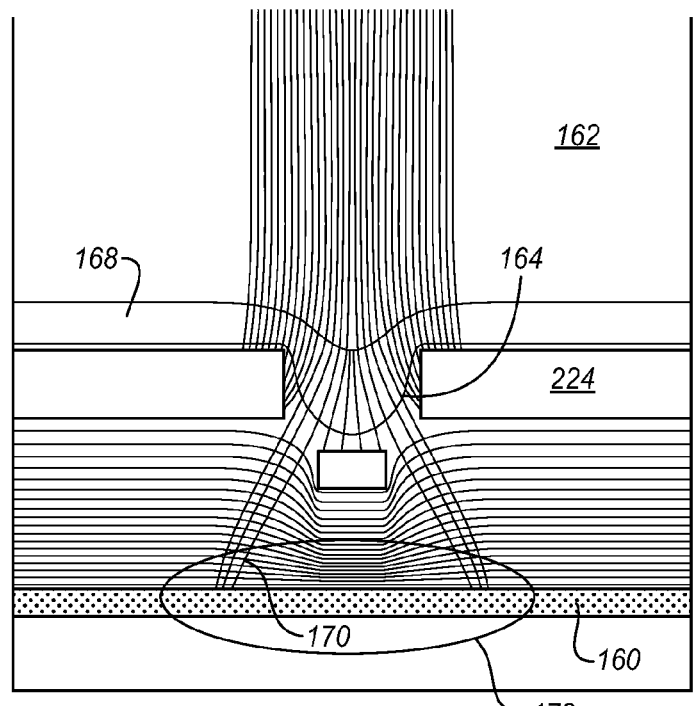

FIG. 1D is a side cross-sectional view of the bimodal angle modifier plate of FIG. 3 in the context of a plasma processing chamber. The plasma 162 has a sheath 168 between the plasma and the plate 224. Due to the configuration of the second plate 226 with respect to the base plate, the plasma has an extension 164 past the aperture 228 to the other side of the base plate. A bias voltage on a workpiece 160 draws the ions through the sheath in a pattern 170 that is controlled in part by the position of the second plate, in part by the size and position of the opening through the plate, and in part by the electrical fields generated by the bias voltage. The observations in the context of FIG. 1A regarding S and d still apply, however, with the bimodal plate, the gap d may be defined as the gap on either side of the second plate to the base plate.

Figure 1E:
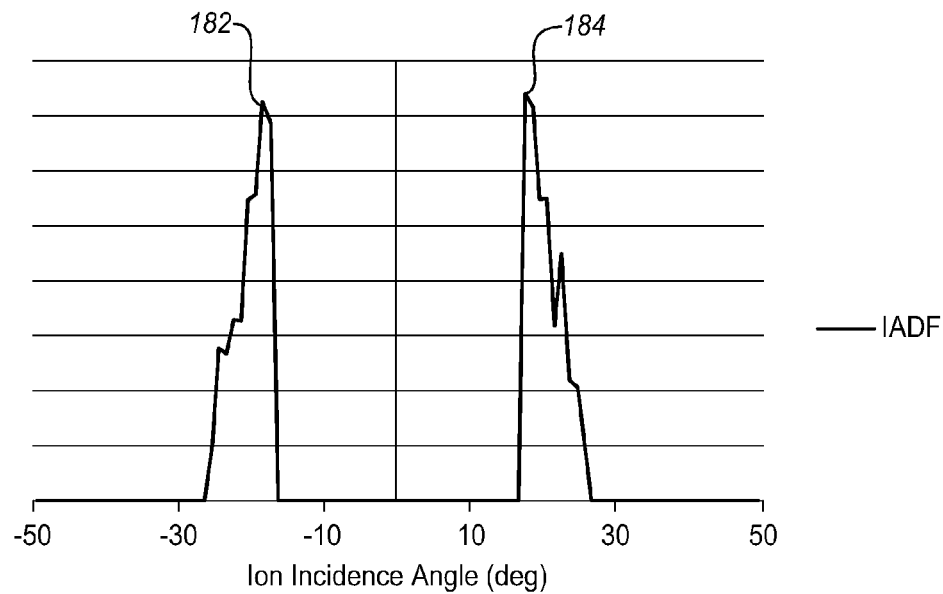
FIG. 1E is a graph of ion incidence angle for the bimodal distribution of FIG. 1D.

A bimodal angular spread 172 of the ions 170 impinging on the workpiece can be created using the configuration shown in FIG. 1D or similarly using the bimodal plate of FIG. 2 in other configurations. FIG. 1E is a graph of IADF for the aperture configuration of FIG. 1D. The vertical axis shows a number of ions and the horizontal axis shows the incident angle of the ions. A bimodal angular spread refers to a first center angle 182 having a first angular distribution and a second center angle 184 having as second angular distribution. Such a bimodal angular spread may also be created by changing the relative vertical position of only two portions of a plate. Using an appropriate sheath thickness, e.g. the sheath thickness is approximately equal to the plate opening, an angled diffused beam is obtained. The middle plate can block the vertical beams so that two angled beams impinge on the workpiece.

In FIG. 1D, the angle modifier effectively has three conductors, the second plate 226 and the two parts 224 of the base plate on either side of the second plate. By arranging the outer two pieces of the base plate on the same vertical plane and maintaining the same horizontal spacing between them, it is possible to create as symmetric bimodal angular spread each centered about the ions that fall on either side of the second plate. The center angles can be modified by varying the vertical spacing between the two outer parts of the base plate and the second plate, so as to vary the gap angles. The angular spread can be modified by varying the horizontal spacing between the two parts of the base plate. An asymmetric distribution can be created by making the two parts of the base plate different heights.

While the conductive plate parts are shown as being planar, this is not a requirement. The plasma sheath generally follows the shape of the plate and is then affected by the bias voltage. Therefore, the sheath can be engineered to take a variety of different shapes that may be linear, non-linear, curved or curvilinear, such that any gap through which the ions travel may be at a variety of different angles to the workpiece.

As described herein a bias voltage can be applied to the plasma, the angle modifier and the workpiece, through the workpiece carrier. This provides a large variety of control configurations to affect the IEDF and the IADF. When RF energy is used it may be scanned or a combination of two or more different combined frequencies may be used. In some embodiments, a scanning frequency RF energy is applied to the plasma source with the angle modifier at ground potential and the workpiece biased at a fixed frequency. In some embodiments, a fixed frequency RF energy is applied to the plasma with the angle modifier driven with a scanning frequency RF bias voltage and workpiece at a fixed frequency. In various embodiments, a ground potential, a DC bias, a fixed or scanning RF bias, or a combined RF and DC bias may be applied to any one or more of the plasma, the angle modifier and the workpiece. Different combinations may be used to produce desired results under different circumstances.

Figure 4A:
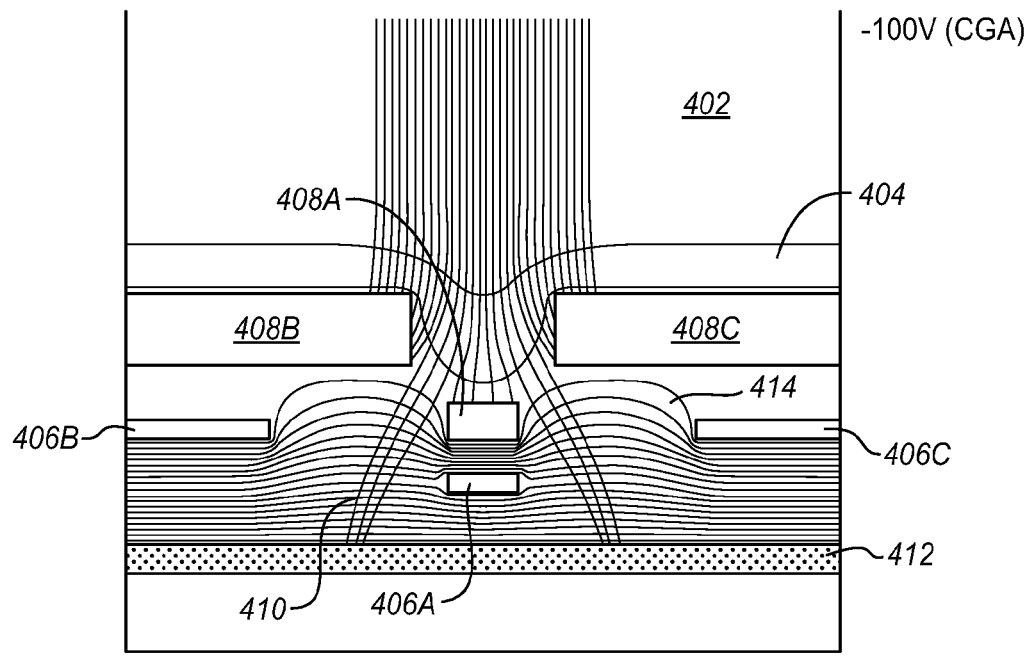
FIGS. 4A, 4E, and 4C are diagrams of a plasma processing apparatus showing ion path angles with different voltage settings proximate a guard plate and an angle modifier aperture according to an embodiment of the present invention.

FIG. 4A is a diagram similar to that of FIG. 1D except that an additional guard plate 408 and corresponding aperture are added between the angle modifier 406 and the plasma sheath 404. The angle modifier 406 has three parts 406A, 406B, and 406C in the same or a similar configuration to that shown in FIGS. 2 and 3, although other configurations may alternatively be used. The second plate 406A is in the gap between the two parts 406B, 406C of the first plate or base plate. The gap between the base plate and the second plate defines the aperture through which ions pass and which modifies the angle of ion propagation to the workpiece.

A bias voltage is applied to a plasma 402 and to a workpiece 412. The angle modifier 406 may also receive a bias voltage or be coupled to a ground potential or be allowed to float. An additional plate 408 is placed between the angle modifier 406 and the plasma sheath 404. This additional guard plate has a configuration the same as or similar to that of the angle modifier. For purposes of the present description, the angle modifier will be referred to as a control plate because it is used to control the IADF and IEDF. The additional plate will be referred to as a guard plate because it guards the control plate from the plasma sheath and vice versa.

The guard plate may be made from any of a variety of conductive or partially conductive materials including silicon, aluminum oxide, or metallic alloys or compounds. The guard plate is typically coupled to a ground potential. The control plate may be grounded as well or it may receive a DC or AC bias voltage as described herein.

The diagram of FIG. 1D suggests that as the ions propagate through the angle modifier, the ions flow around the plates and through the apertures. While this is true for many of the ions, many ions also strike the control plate. The harms the parts of the control plate that are near the aperture and degrades the control plate 224, 226 with use over time. In addition, as may be seen by comparing FIGS. 1A, 1B, and 1C, the shape of the plasma sheath varies depending on the configuration of the control grid. The shape of the plasma sheath is also changed by changes in the applied bias voltages.

The guard plate 408 also shields the plasma 402 from the electrical field of the control plate 406. The control plate still controls the electric field between the guard plate 408 and the workpiece 412. As a result the control plate controls the IADF without affecting the ion energy and the plasma. By de-coupling the plasma from the control plate, the control plate can provide a more precise and direct control of the IADF than a system without the guard plate. The IADF can be changed significantly by changing the voltage applied to the control plate, the workpiece or both. The bias voltage may be DC or AC or a combination.

In the example of FIG. 4A a DC bias voltage is applied to the secondary plate 406A of the control grid and the base plate 406B, 406C is at ground potential just as the guard plate 408 is at ground potential. This is indicated by −100V (CGA). The electric field lines 414 of the control gird and the ion paths 410 are simulated based on a −100V bias voltage under typical plasma ion implantation process conditions. As shown, the electrical field lines curve upward from the control plate 406A, 406B, 406C toward the plasma and plasma sheath. Similarly the plasma 402 and plasma sheath 404 are drawn down toward the bimodal apertures of the control plate. However the guard plate 408 provides a displacement between the control plate and the plasma sheath so that the electrical field lines do not interact with the plasma or plasma sheath.

Figure 4B:
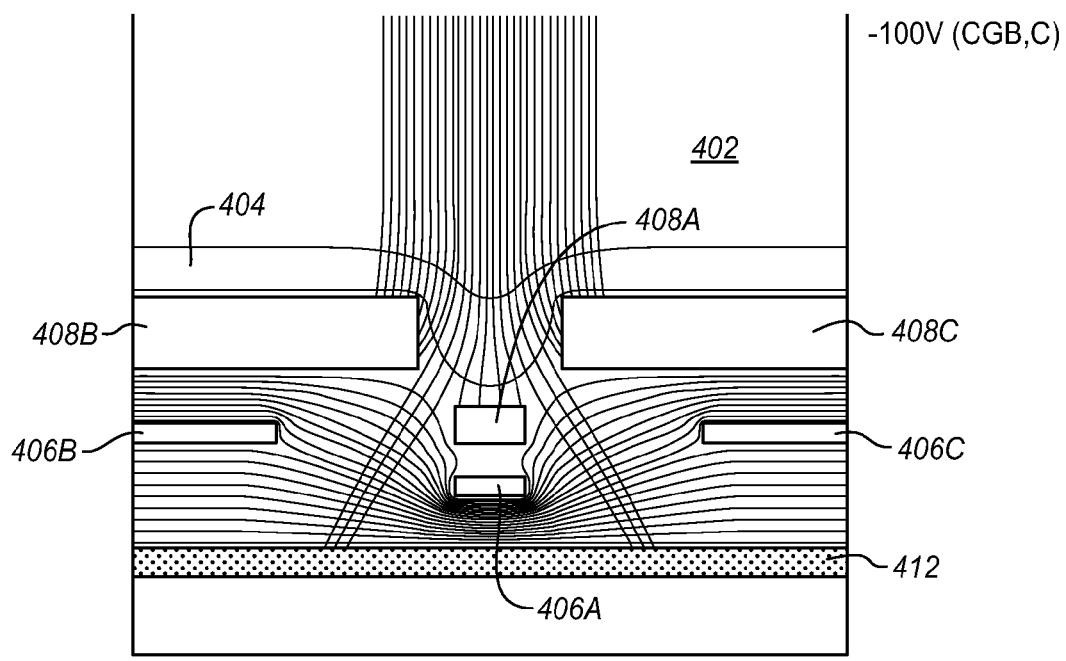
Figure 4C:
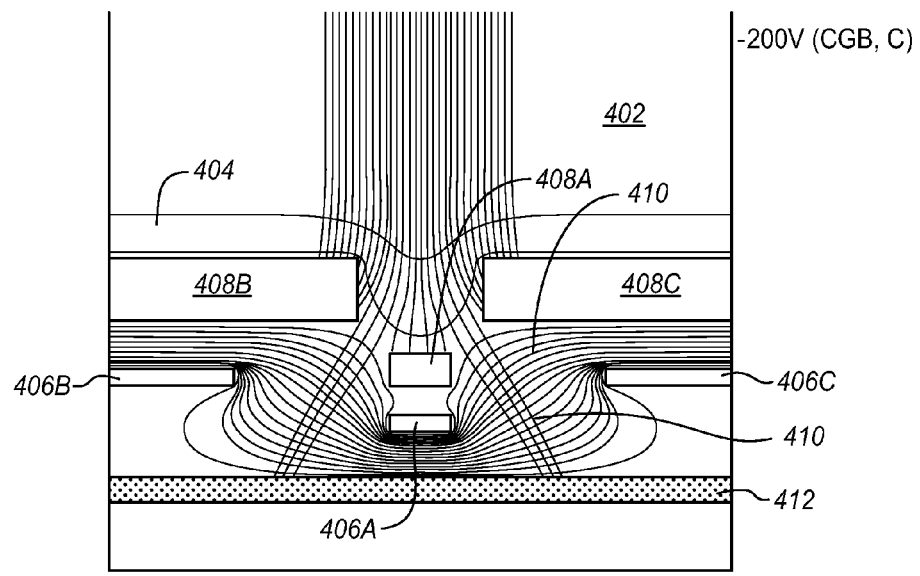

In FIG. 4B, the same process conditions and apparatus are shown, however, the secondary plate 406A of the control grid is at ground potential and the −100V bias voltage is applied to the base plate of the control plate. This is indicated by −100V(CGB,C). In FIG. 4C, the same process conditions and apparatus are shown, however, a −200V bias voltage is applied to the base plate while the secondary plate of the control grid is grounded. This is indicated by −200V (CGB,C) These three figures show that the shape of the plasma 402 and the plasma sheath 404 are not changed even though the electric field lines of the control plate change. In addition, the IADF changes with the changes in voltage. As shown in these simulations, while the electrical field lines change significantly in each diagram, the plasma and plasma sheath lines are unchanged due to the protection of the guard plate 408.

Figure 5:
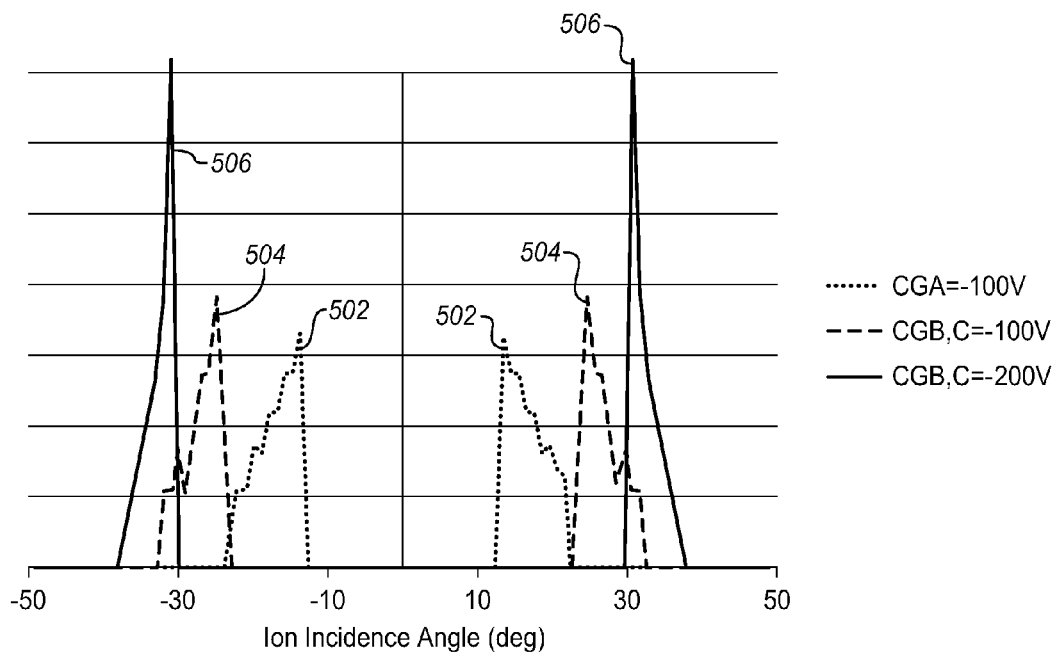
FIG. 5 is a graph of ion angle distribution for the bimodal distributions of FIGS. 4A, 4B, and 4C according to an embodiment of the present invention.

FIG. 5 is a graph of ion incidence angle for ion incidence on the workpiece 412 for each of the three voltage conditions. The innermost plots 502 correspond to the voltages of FIG. 4A and indicate the most narrow incidence angles and the least precise distribution. The intermediate plots 504 correspond to FIG. 4B and show a wider incidence angle and a more precisely focused distribution. In other words, the range of incidence angles is less for the voltages of FIG. 4B than those of FIG. 4A. The outermost plots 506 show a still wider incidence angle and still smaller range of angles within the distribution.

These results show that the IADF can be changed by changing the bias voltage. As a result, the incidence angles may be modified during a single process for different locations on the workpiece and for different stages of processes being performed in a processing chamber. These changes may be made without moving any equipment and without disturbing the processing chamber. Only the applied bias voltage is changed. For additional control over the IADF and the IEDF, other parameters may also be changed such as the pressure differential, positions of different components of the process, and bias voltages applied to the other components of the system.

Figure 6:
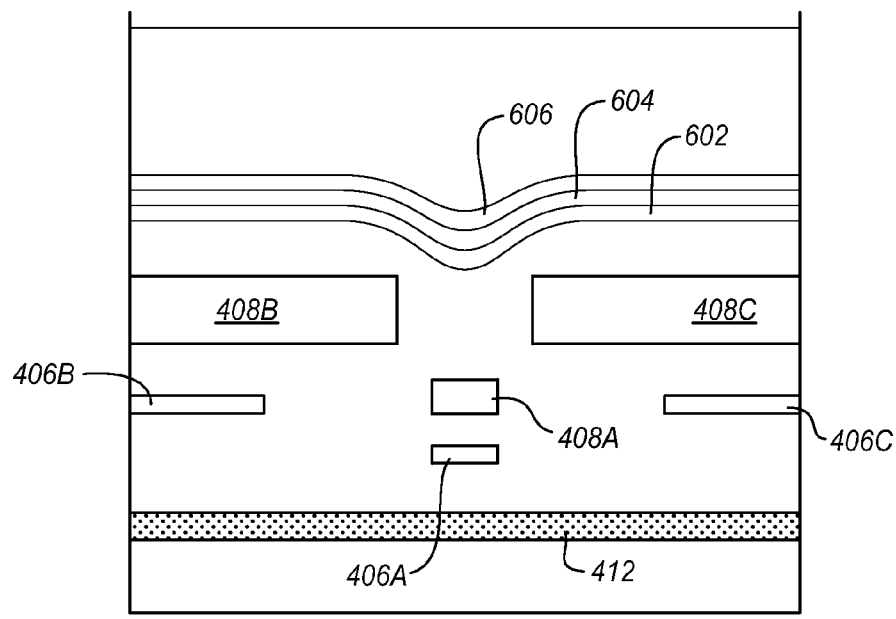
FIG. 6 is a diagram of a plasma processing apparatus showing plasma electron density proximate a guard plate for the different voltage settings of FIGS. 4A, 4B, and 4C according to an embodiment of the present invention.

FIG. 6 is a diagram of the plasma density for the configuration of FIGS. 4A, 4B, and 4C. The plasma density is the same in each circumstance because of the guard plate 408. There are electron density contour lines 602, 604, 606 over the aperture in the guard grid. These contour lines show a dip over the aperture from a straight horizontal level across the guard plate. However, the amount of dip or the traversal toward the aperture in the guard plate is the same for each of the three voltage settings of FIGS. 4A, 4B, and 4C. This table shows that the density of the plasma and the IEDF is independent of the IADF when the guard plate is used.

Figure 7:
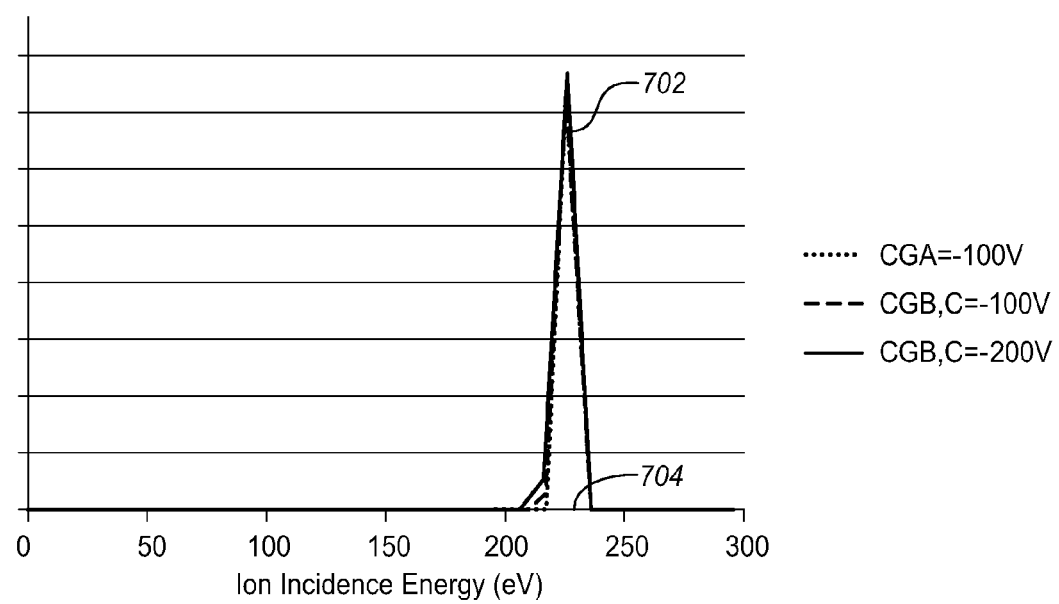
FIG. 7 is a graph of ion energy distribution for the different voltage settings of FIGS. 4A, 4B, and 4C according to an embodiment of the present invention.

FIG. 7 is a graph of IEDF for the three different voltage settings of FIGS. 4A, 4B, and 4C. The distribution is shown on the vertical scale and the incident energy (e.g. eV) is shown on the horizontal scale. There is a single peak 702 centered about a single energy level 704. The same peak is found for all three voltage settings. This shows that regardless of the IADF, the energy distribution is the same. The energy distribution is separately controlled by controlling the plasma energy.

Figure 8:
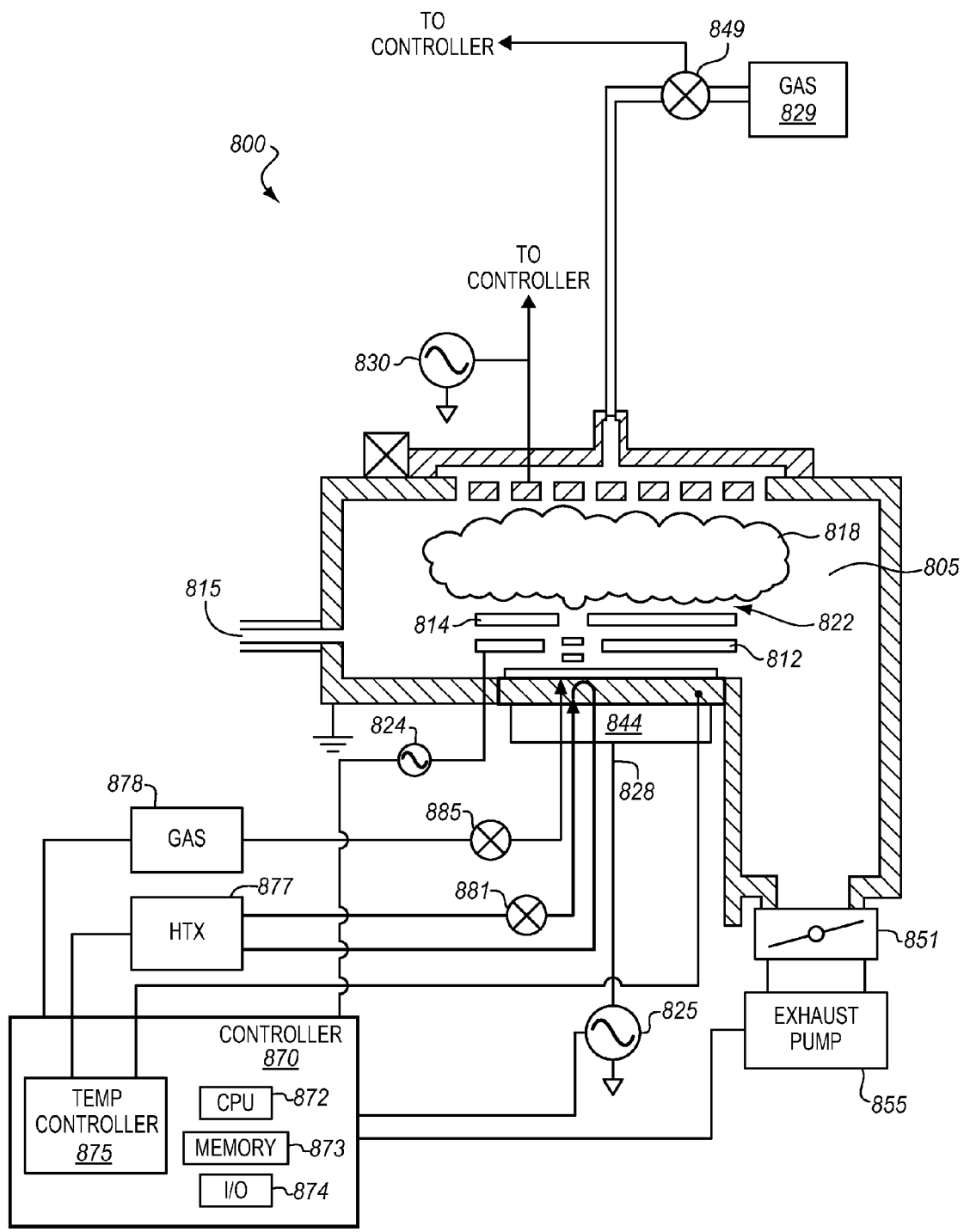
FIG. 8 is a diagram of a plasma processing apparatus for a workpiece according to an embodiment of the present invention.

FIG. 8 is a schematic of a wafer processing system 800 that may be used for plasma etch, ion doping, ion deposition, or for a variety of other purposes. The system includes a workpiece support assembly 842 which may be a platen, a carrier, a chuck, a pedestal, or any other workpiece support system. The processing system 800 may be any type of chamber known in the art, such as, but not limited to, Enabler®, DPS II®, AdvantEdge™ G3, EMAX®, Axiom®, or Mesa™ chambers, all of which are manufactured by Applied Materials of California, USA. Other commercially available processing chambers may similarly utilize the techniques and apparatus described herein. While the exemplary embodiments are described in the context of a plasma etch system, the techniques and apparatus described herein is also adaptable to other processing systems used to perform other fabrication process (e.g., plasma deposition systems, three-dimensional printing systems, etc.)

The processing system 800 includes a grounded chamber 805. Process gases are supplied from gas source(s) 829 connected to the chamber through a mass flow controller 849 to the interior of the chamber 805. The gas source may be used as the primary source of dopants or etchants to the chamber. Any of a variety of suitable ionizable gases may be used in the process chamber. Examples of an ionizable gas include, but are not limited to, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $CHF_3$, $CF_4$, $C_2F_4$, $C_2F_6$, $C_2F_8$, $AsF_5$, $PF_3$, and $PF_5$, among others.

The chamber 805 is evacuated via an exhaust valve 851 connected to a high capacity vacuum pump stack 855. When plasma power is applied to the chamber 805, a plasma 818 is formed in a processing region over a workpiece 810. A plasma bias power 825 is coupled into the wafer support assembly 842 to draw the energized ions from the plasma to the workpiece. The plasma bias power 825 may be in a range of from 0.5 MHz to 60 MHz. The plasma bias power 825 is coupled to a lower electrode (not shown) via a power conduit 828. A second plasma source power 830 or branch of the same source is coupled to a plasma generating element 835 to provide high frequency source power to inductively or capacitively energize the plasma. The plasma source power 830 may have a higher frequency than the plasma bias power 825, such as between 1.8 and 880 MHz, and may, for example, be in the 13.56 MHz band. The pressure within the chamber may be controlled using the gas source valve 829 and the exhaust pump 855 under the control of a controller 870.

The workpiece 810 is loaded through an opening 815 and placed on the wafer support assembly 842 inside the chamber. The workpiece may be clamped, glued, or attached using an electrostatic force, vacuum or gravity. The workpiece 810, such as a semiconductor wafer bonded to a carrier, may be any type of wafer, substrate, or other material, including silicon, glass, or polymer for use in semiconductors, solar panel, optical waveguides, micromachines and other devices. The workpiece 810 is disposed on a top surface of a carrier that is disposed over a base assembly 844 of the chuck assembly. The base assembly provides temperature control, scanning, or other types of motion control. A scanning stage, which may be part of the base assembly, may be used to scan the workpiece across the aperture or across multiple apertures to process one or more different locations or two-dimensional features on the workpiece.

A system controller 870 is coupled to a variety of different systems to control a fabrication process in the chamber. If the workpiece support is a thermally controlled chuck assembly, then the controller 870 may include a temperature controller 875 to execute temperature control algorithms (e.g., temperature feedback control) and may be either software or hardware or a combination of both software and hardware. The system controller 870 also includes a central processing unit 872, memory 873 and input/output interface 874.

The temperature controller receives a temperature reading from a sensor 843 on the chuck. The temperature sensor may be proximate a coolant channel, proximate the wafer, or placed in the dielectric material of the chuck. The temperature controller 875 uses the sensed temperature or temperatures to output control signals affecting the rate of heat transfer between the chuck assembly 842 and a heat source and/or heat sink external to the plasma chamber 805, such as a heater power supply 876 and a heat exchanger 877. The heater power supply provides current to drive one or more heaters (not shown) within the chuck assembly 842.

The system may also include a controlled heat transfer fluid loop 841 with flow controlled based on the temperature feedback loop. In the example embodiment, the temperature controller 875 is coupled to a heat exchanger (HTX)/chiller 877. Heat transfer fluid flows through a valve 881 at a rate controlled by the valve through the heat transfer fluid loop 841. The heat transfer fluid flows through conduits in the chuck assembly 842 and then returns to the HTX 877. The temperature of the heat transfer fluid is decreased by the HTX and then the fluid is returned through the loop back to the chuck assembly.

The valve 881 (or other flow control devices) between the HTX 877 and fluid conduits in the chuck assembly 842 may be controlled by the temperature controller 875 to control a rate of flow of the heat transfer fluid to the fluid loop. The electric heaters are used in the chuck assembly to apply heat to the chuck assembly.

A backside gas source 878 such as a pressurized gas supply or a pump and gas reservoir are coupled to the chuck assembly 842 through a mass flow meter 885 or other type of valve. The backside gas may be argon or any gas that provides heat conduction between the wafer and the chuck without affecting the processes of the chamber. The gas source pumps gas through a gas outlet of the chuck assembly to the back side of the wafer under the control of the system controller 870 to which the system is connected.

A conductive sheath modifier or control grid 812 includes a pair of panels defining a gap having a horizontal spacing. The sheath modifier may be formed of one piece, two pieces, or more pieces. The panels may be a pair of sheets having a thin, flat shape, or any other desired shape including tube shaped, wedge shaped, or beveled. They may be formed of a conductor, semiconductor, or insulator material, depending on the particular implementation. The horizontal spacing of the gap defined by the pair of flat plate parts may be about 6.0 millimeters (mm). The pair of panels may also be positioned a vertical spacing (Z) above the plane of the top surface of the workpiece of about 3.0 mm. A guard grid 814 is positioned between the control grid 812 and the plasma 818.

The sheath modifier modifies the electric field within a plasma sheath 822 to control a shape of the boundary between the plasma 818 and the plasma sheath 822. In the illustrated example, the plasma angle modifier is a plate formed of a pair of conductors which may be fabricated of silicon carbide, doped silicon, doped anodized aluminum, molybdenum, etc. Alternatively, the sheath modifier may be formed of a single basis plate with a secondary plate all formed from the same or a similar material. When the bias source 825 biases the workpiece 810, ions are attracted across the plasma sheath through the gap, opening, or aperture in the plate at a selected range of incident angles. The angles depend on several different parameters including, but not limited to, the size of the gap, the vertical spacing (Z) of the base plate and the secondary plate above the workpiece, the dielectric constant and resistance of the plate, any bias applied to the plate, the bias applied to the workpiece, and other plasma process parameters.

A separate bias voltage may also be applied to the control grid 812 using a separate plate bias voltage supply 824 under the control of the controller 870. The control grid bias may be a constant DC voltage, a pulsed DC voltage, or an RF bias voltage. Alternatively, the control grid may be grounded or allowed to float. The control grid bias cooperates with the workpiece bias and the grid configuration to control the angular distribution of the plasma ions through the sheath. The plate may also be coupled to an actuator and in FIG. 5A to modify the parameters of the plate to suit a particular process. In some embodiments, no plate is used and the bias voltage on the workpiece is used to control the plasma ions.

The process chamber of FIG. 8, or another process chamber, may be used to create a variety of different ion energy distributions and ion angular distributions. In one example, the ion energy distribution is controlled in the chamber using a plasma that is generated with a Capacitively Coupled Plasma (CCP) source or an Inductively Coupled Plasma (ICP) source. Power within a range from about 400 W to 2000 W power is applied to the plasma source to ignite and maintain the plasma. An RF source is applied to an electrostatic wafer chuck to control ion energy. Compared to a DC biased workpiece, the RF biased workpiece significantly reduces the charge damage to the workpiece and allows precise control of IADF.

The driven frequency of RF bias is in the range of 0.5 MHz to 60 MHz. The RF bias voltage is in the range of 100V p-p to 8000V p-p. Depending on the application, a different RF frequency power may be chosen to be applied to the pedestal. For example, in MRAM etch, two different ion angular fluxes are preferred. An undeflected or zero angle, high energy, ion flux is desired for vertical etch, but a high angle low energy ion flux is suitable for sidewall cleaning. Therefore compared to a high driven frequency, a low driven frequency works better in this case. As described above and shown in the context of FIGS. 1-4, the RF bias voltage frequency may be used to control the span of bimodal peaks of the IEDF. The RF bias voltage power may be used to control the magnitude of ion energy.

As described above, the geometry of the plate may be used to control the ion flux angle. A bimodal sheath modifier plate may be made, for example of SiC or a doped Si block. A 20 mm to 30 mm wide slit may be machined on the base plate. A 15 mm to 20 mm wide second plate may be mounted 3 mm to 5 mm above or below the base plate.

The sheath plate may be inserted into the plasma and placed 5 mm-10 mm above the workpiece, for example a wafer substrate. The plates may be grounded to zero potential so that the critical dimension of the sheath thickness is thinner than the plate opening. As a result, the ions are focused along the angle which is determined by the sheath shape around the plate surface. The two openings formed by the combined base plate and second plate create a bimodal angled ion flux that is collected on the wafer.

In such a plate, the ion energy along different angles is controllable. This allows for the process to be optimized for very small features. Compared to conventional dry plasma processes, the controlled angle allows for control over the quality of three dimensional processes. Different topographical features may be treated with different ion energy values.

As described herein, an RF biased plasma reduces charging damage to the workpiece. The ion energy angular distribution varies by changing the bias driven frequency and the geometry of the plate. Using a grounded extraction plate with a slit aperture in a plasma, different plasma beams, that is different ion flux values along different angles is achieved. Using a biased extraction plate additional control may be obtained over the angular distribution of the ions may be obtained. The plate may be biased with a constant DC, pulsed DC, or RF voltage supply. The control over angles is particularly helpful in plasma related process, such as 3-D selective etch, 3-D selective deposition, 3-D implantation etc.

Using the chamber of FIG. 8, a workpiece can be processed. As described above, a variety of different processes can be performed, from deposition, to etching, to amorphization, etc. A three dimensional feature, may be etched with a desired width, depth and taper by controlling the IADF and IEDF. In one example, the plasma is generated at the plasma source with a particular RF plasma frequency and power. The plasma will have a plasma sheath adjacent to a front surface of the workpiece. When a plate is positioned between plasma sheath and the workpiece, then the sheath is formed near the plate.

FIGS. 4A, 4B, 4C and 6 show a control grid and a guard grid that have two parallel parts at one level and a third part at a second level to define an aperture. A radio frequency bias voltage is applied to the workpiece, to control an angular bias of the ions from the sheath through the control aperture in the excitation plate to the workpiece. The ions are accelerated between the plasma sheath and the workpiece by the bias voltage, e.g. to etch a three dimensional feature on the front surface of the workpiece.

In some processes chemical precursors are introduced into the plasma source before generating the plasma. The plasma contains reactive or inert gas ions. The reactive gas ions may be used to deposit a material such as an elemental semiconductor, a compound semiconductor, an oxide, a nitride, a carbide, a silicide, a ternary compound, an elemental metal, a metallic compound, a metallic alloy, a polymeric material, or a composite material. A variety of different ions may be used such as PxHy, PxCy, BxHy, BxCy, CxPyHz, and CxByHz, H2, or noble gases, where x, y, and z are integers greater than or equal to 1. In other processes the plasma contains only inert gas ions and the ions are used perform a mechanical process. Other types of plasmas and processes may be used as well.

One process is to generate the plasma in a plasma chamber that has a control plate and a guard plate between a workpiece and the plasma. The plasma will form a sheath above the workpiece next to the guard plate. The control plate has an aperture disposed between the plasma sheath and the workpiece to allow ions to pass through the control plate to the workpiece. The control plate is configured to modify the sheath to control the shape of the sheath.

An oscillating radio frequency bias voltage may be generated and applied to a workpiece holder, which applies the bias voltage to the workpiece. This generates a workpiece bias voltage with respect to the plasma to attract ions across the plasma sheath toward the workpiece. The control plate aperture and the frequency of the bias voltage control the angle at which the ions are attracted toward the workpiece. If the workpiece has a top dielectric layer facing the plasma sheath then the top dielectric layer is alternately charged and discharged by the bias voltage.

A variety of different frequencies may be used for the bias voltage based on a desired angle at which the ions are attracted toward the workpiece. The frequency may be within a range of from 0.5 to 80 MHz in many cases. The bias voltage frequency may also be a combination of two or more oscillating radio frequency bias voltages. The second bias voltage may be at a second frequency or a second voltage or both. These are combined to control the angle at which the ions are attracted toward the workpiece. There may also be a delay between the RF signals to reduce or manage beat frequencies.

For some processes, in addition to controlling the plasma parameters and the bias voltages, the separation between the aperture and the plasma sheath may be adjusted to adjust the angle at which the ions are attracted toward the workpiece. This may be done by physically moving one or more pans of the plate or by adjusting the plasma parameters.

A bias voltage may also be applied to the control plate at the aperture or across the whole plate. The control plate bias voltage may be a DC voltage, a pulsed DC voltage, or a second oscillating radio frequency bias voltage. Alternatively, the control plate may be grounded or allowed to float. Further control may be obtained by establishing a pressure differential between the plasma chamber and the workpiece while the ions are attracted toward the workpiece. The pressure differential has a first gas pressure in the plasma chamber that is higher than a second gas pressure proximate the workpiece.

Figure 9:
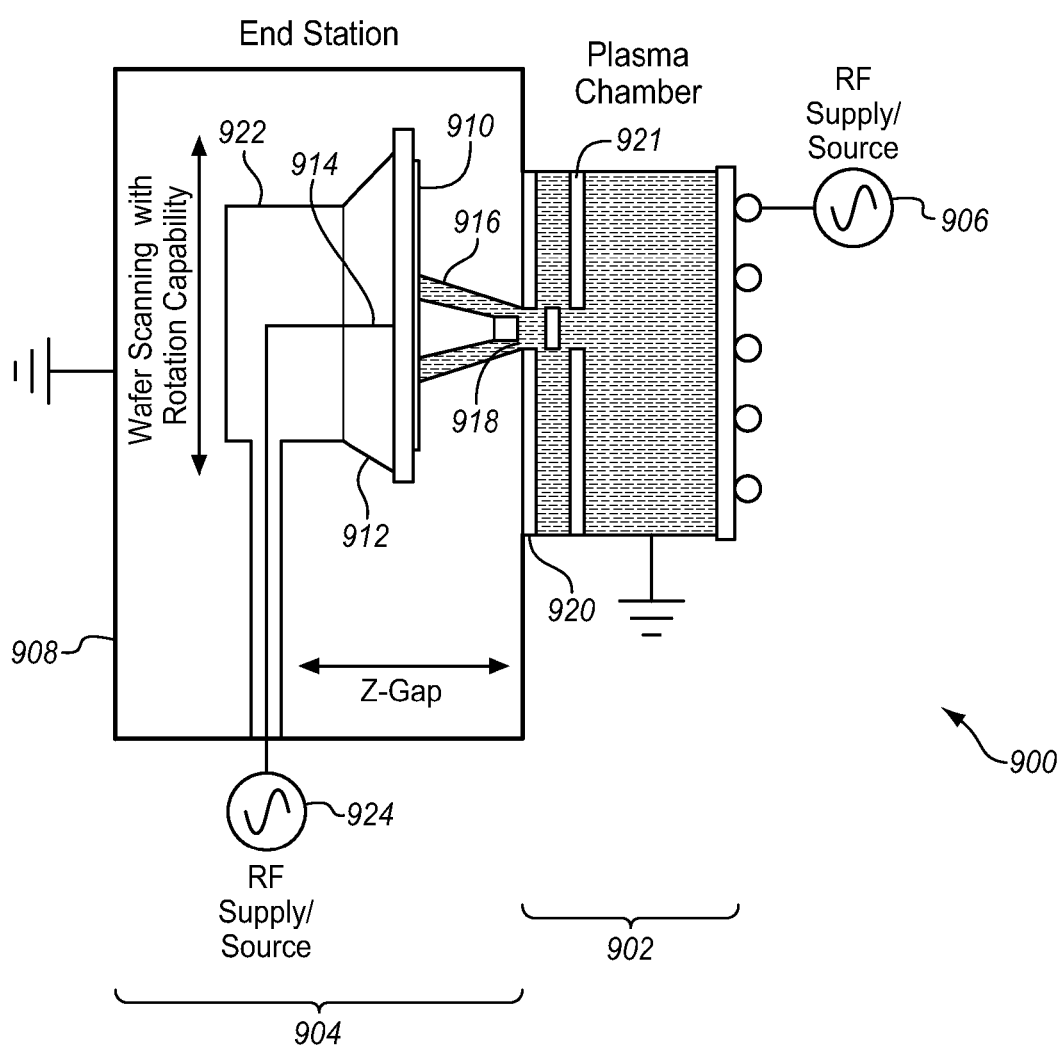
FIG. 9 is an alternative diagram of a plasma processing apparatus for a workpiece using a pedestal and a scanning stage according to an embodiment of the present invention.

FIG. 9 is an alternative diagram of a plasma processing system 900 according to an embodiment. The processing system has a plasma chamber portion 902 and an end station portion 904. The plasma chamber system may be similar to that of FIG. 8 and may include a source of gases, an RF source 906 to energize the plasma, a source for precursor chemicals to be introduced into the plasma and a variety of other components, depending on the particular process to be performed in the system and the particular implementation.

The end station portion includes a vacuum chamber 908 which contains a workpiece 910, such as a silicon wafer or any other desired type of material. The workpiece is carried by a pedestal 912 which may hold the wafer using electrostatic, vacuum, adhesive, or any other desired holding means. The pedestal holds the workpiece in place and may also provide thermal control, gas flow, and any other desired process elements. The pedestal receives a bias voltage 914 from a power source 924 as described above to draw ions 916 from the plasma to the workpiece. The ions are drawn through an aperture 918 in a guard plate 921 and a control plate 920. While only one aperture is shown, the plates may have one or more apertures depending on the particular process and how the process is to be performed.

The aperture 918 serves as an angle modifier to modify the angular bias of the plasma ions. In the illustrated example, the ions propagate at two complementary angles through the aperture to strike the workpiece 910 in two different locations. As described above, the particular position, angular bias, and number of ion beams may be modified by modifying the configuration of the plasma angle modifier 920 and by modifying the bias voltage, if any, applied to the angle modifier and the workpiece.

The pedestal is mounted to a scanning stage 922. The scanning stage has actuators (not shown), such as hydraulic pistons, solenoids, or stepping motors with appropriate gear train to provide two-dimensional (X-Y) lateral translation to move the workpiece across the aperture. By moving the workpiece in X and Y any desired position on the surface of the workpiece may be positioned under the aperture. Any feature on the workpiece may, accordingly, be treated with the plasma ion beam 916. By moving the workpiece across the aperture, the entire surface of the workpiece may be processed using only one aperture.

The scanning stage 922 may also offer rotation about an axis normal to the surface of the workpiece using a rotation electric motor and drive train (not shown) or any other desired drive system. Since the plasma beam ions 916 strike the workpiece at an angle, the effect of the ions differs depending on the rotational position of the workpiece. In the illustrated example, the workpiece pedestal may be rotated and translated simultaneously so that the angle and position of ion impact on the workpiece may be controlled. While the scanning stage is shown as moving the pedestal with respect to the aperture, the scanning stage may be attached instead or in addition to the plate aperture. The aperture would then move laterally with respect to the top surface of the workpiece. Any relative motion between the workpiece and the aperture will allow the ions to be applied to different locations on the workpiece.

It is to be understood that the above description is intended to be illustrative, and not restrictive. For example, while sequential diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A workpiece processing system comprising:
a plasma chamber,
a plasma source to generate a plasma containing gas ions in the plasma chamber, the ions having an electric charge, the plasma forming a sheath above the workpiece, the sheath having an electric field;
a workpiece holder in the chamber to apply a bias voltage to the workpiece to attract the charged ions across the plasma sheath to be incident on the workpiece;
a control aperture between the sheath and the workpiece, the aperture having an electric field and being positioned to modify an angular distribution of the ions that are incident on the workpiece; and
a guard plate between the sheath and the control aperture to isolate the electric field of the control aperture from the plasma sheath, the guard plate having an aperture to permit ions to pass from the plasma sheath to the control aperture.

2. The system of claim 1, wherein the workpiece has a top dielectric layer facing the plasma sheath and wherein the top dielectric layer is alternately charged and discharged by the bias voltage.

3. The system of claim 1, wherein the control aperture is formed of a first sheet between the workpiece and the sheath having a gap and a second sheet between the first sheet and the workpiece extending across the gap, the second sheet being displaced form the first sheet so that there is an opening on either side of the second sheet above the second sheet.

4. The system of claim 3, wherein the guard plate is formed of a first sheet between the control aperture and the sheath having a gap and a second sheet between the first sheet and the control aperture extending across the gap, the second sheet being displaced from the first sheet so that there is an opening on either side of the second sheet above the second sheet.

5. The system of claim 1, wherein a bias voltage on the control aperture controls an angle at which the ions are incident on the workpiece to etch a three dimensional feature on the front surface of the workpiece.

6. The system of claim 1, further comprising a scanning stage to scan the workpiece laterally relative to the aperture so that different parts of the workpiece receive the ions from the sheath.

7. The system of claim 1, wherein the range of incident angles is a bimodal distribution, having two center angles with distributions about each center angle.

8. The system of claim 1, wherein the guard plate is coupled to a ground potential.

9. A guard plate of a workpiece processing system comprising:
a first sheet configured to be positioned between a control aperture and a plasma source within a plasma processing chamber of the workpiece processing system, the first sheet having a gap, the control aperture being between the guard plate and a workpiece of the workpiece processing system to modify an angular bias of ions propagating from the plasma to the workpiece through the guard plate and the control aperture in response to a bias voltage between the plasma and the workpiece; and
a second sheet between the first sheet and the control aperture extending across the gap, the second sheet being displaced from the first sheet so that there is an opening on either side of the second sheet above the second sheet to permit ions to pass through the control aperture to the workpiece.

10. The guard plate of claim 9, wherein the first and second sheets are formed of silicon carbide, doped silicon, doped anodized aluminum, and/or molybdenum.

11. The guard plate of claim 9, wherein the second sheet is vertically lower than the first sheet and attached to the first sheet.

12. The system of claim 1, wherein the ions comprise reactive gas ions operable to deposit a material comprising one or more of: an elemental semiconductor, a compound semiconductor, an oxide, a nitride, a carbide, a silicide, a ternary compound, an elemental metal, a metallic compound, a metallic alloy, a polymeric material, or a composite material and wherein the ions are selected from the group consisting of $P_xH_y$, $P_xC_y$, $C_xH_y$, $C_xF_y$, $C_xH_yF_z$, $B_xH_y$, $B_xC_y$, $C_xP_yH_z$, $C_xB_yH_z$, $H_2$, and noble gases, wherein x, y, and z are integers greater than or equal to 1.

13. The system of claim 1, wherein the charged ions are incident on the workpiece at an angle that is controlled by at least one of plasma power, bias voltage, bias voltage frequency, pressure, and temperature.

14. The system of claim 1, wherein the control plate is formed of an electrically conductive material.

15. The system of claim 1, further comprising a mechanical actuator to move the position of the guard plate with respect to the distance between the guard plate and the workpiece.

* * * * *